United States Patent
Park

(10) Patent No.: US 7,176,122 B2
(45) Date of Patent: Feb. 13, 2007

(54) DIELECTRIC WITH SIDEWALL PASSIVATING LAYER

(75) Inventor: Hyun-Mog Park, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/379,061

(22) Filed: Mar. 4, 2003

(65) Prior Publication Data

US 2004/0175925 A1 Sep. 9, 2004

(51) Int. Cl.
H01L 21/4763 (2006.01)

(52) U.S. Cl. .................. 438/634; 438/637; 438/639

(58) Field of Classification Search ............. 438/634, 438/637, 638, 639, 640, 627, 643, 725, 734, 438/738, 740, 780
See application file for complete search history.

(56) References Cited

U.S. PATENT DOCUMENTS

| | | | |
|---|---|---|---|
| 6,025,259 A * | 2/2000 | Yu et al. ............. | 438/618 |
| 6,303,489 B1 * | 10/2001 | Bass ..................... | 438/624 |
| 6,340,435 B1 * | 1/2002 | Bjorkman et al. ....... | 216/72 |
| 6,372,634 B1 * | 4/2002 | Qiao et al. ............. | 438/637 |
| 6,410,424 B1 * | 6/2002 | Tsai et al. ............. | 438/637 |
| 6,458,691 B1 * | 10/2002 | Subramanian et al. .... | 438/638 |
| 2002/0173142 A1 * | 11/2002 | Vanhaelemeersch et al. | 438/637 |
| 2002/0173143 A1 * | 11/2002 | Lee et al. ............. | 438/637 |

* cited by examiner

Primary Examiner—Walter L. Lindsay, Jr.
(74) Attorney, Agent, or Firm—Trop, Pruner & Hu, P.C.

(57) ABSTRACT

A polymer dielectric material includes a sidewall passivating layer on the opposing sidewall surfaces of an opening in the dielectric layer for a via or trench. The sidewall passivating layer may be deposited on the sidewall surfaces, as well as the bottom surface of an opening having a first depth in the polymer dielectric layer. After the sidewall passivating layer is added, the depth of the opening may be increased to a second depth. The sidewall passivating layer provides a barrier to removal of the polymer dielectric from the sidewalls, preventing or reducing undercutting below a hard mask.

20 Claims, 3 Drawing Sheets

DIELECTRIC WITH SIDEWALL PASSIVATING LAYER

FIELD OF THE INVENTION

The present invention relates to a method for making integrated circuits, and more specifically to the formation of layers having low dielectric constants.

BACKGROUND

Integrated circuits are made by forming on a substrate, such as a silicon wafer, layers of conductive material that are separated by layers of a dielectric material. Openings called vias and trenches may be etched through the dielectric layers, then filled with a conducting material to electrically connect the separated conductive layers.

A commonly used material to form a dielectric layer is silicon dioxide. Although a thermally stable and mechanically strong material, silicon dioxide has a relatively high dielectric constant. Consequently, certain materials such as various organic polymers that have a relatively low dielectric constant may be used as a dielectric material in place of silicon dioxide. When such materials are used in place of those with a higher dielectric constant, RC delay may be reduced, which can enable a higher speed device.

Etching is a process of removing selected portions of a layer from a wafer surface through openings in a hard mask with a specified resist pattern. Dry etching typically is used to obtain sufficient control and precision for integrated circuits with features below 3 µm. Dry etch techniques include plasma etching, ion beam etching, and reactive ion etching. Plasma etching requires a chemical etchant and an energy source. For example, a plasma etcher may include a chamber, vacuum system, gas supply, and power supply. The wafers may be loaded into the chamber, the pressure inside is reduced by the vacuum system, and the chamber is filled with the reactive gas. For example, to etch silicon dioxide, the gas may be $CF_4$ mixed with oxygen. The energy source, such as a power supply that creates a radio frequency field through electrodes in the chamber, energizes the gas mixture to a plasma state. In the energized state, the etchant attacks the dielectric material, converting it into volatile components that are removed by the vacuum system.

Polymer-based dielectrics may be etched with chemical etchants that include and/or are based on $O_2$-based chemistry. The etchant also may include additives such as $N_2$, $H_2$, or CO. Ion bombardment also may be used to etch a polymer dielectric material, in conjunction with a chemical etchant. Typically, some over-etching is done of the polymeric dielectric material. Over-etching may be needed to ensure complete removal of the selected material, at least in part due to variations in material thickness and etch non-uniformity across the surface.

However, over-etching also can cause or increase a problem referred to as undercutting. Undercutting is the unwanted removal of dielectric material below the edges of a mask. In general, etching of a dielectric can result in undercutting because etching tends to be somewhat non-directional, or isotropic, especially with polymer dielectrics. Undercutting results in sidewall surfaces that are not vertical, but are bowed. If etch time is increased, the etching may remove even more of the polymeric dielectric material from underneath the mask, worsening the undercutting problem. Although attempts to reduce undercutting have been made by simply reducing the over-etch time, this is not a practical solution because some over-etch is needed to compensate for material thickness variations and etch non-uniformity.

The undercutting problem is an obstacle to the development of smaller and faster devices, because undercutting can result in variations and departures from designs that seek to minimize spacing of dielectric materials between conductive elements such as conductive elements in vias and trenches, misalignment of conductors and/or insulating elements extending through or into the etched dielectric layers, and other similar problems. What is needed is a device without the undercutting problem, that has more vertical sidewalls on the sides of an opening in a polymer dielectric layer. A method for etching a polymer dielectric with a low dielectric constant is needed that will reduce, minimize or eliminate the undercutting problem.

DETAILED DESCRIPTION

In FIGS. 1A through 1F cross sections of a semiconductor structure are shown and described in accordance with some embodiments of the invention. First referring to FIG. 1A, substrate 100 is provided, which may include a myriad of devices, materials and structures used to form integrated circuits. Conductive layer 101 is formed on substrate 100. Conductive layer 101 may be formed by a chemical vapor or physical deposition process, like those that are well known to those skilled in the art. Alternatively, where copper is used to make conductive layer 101, a conventional copper electroplating process may be used. Such a process typically comprises depositing a barrier layer followed by depositing a seed material, then performing a copper electroplating process to produce the copper line.

Figure 1A:
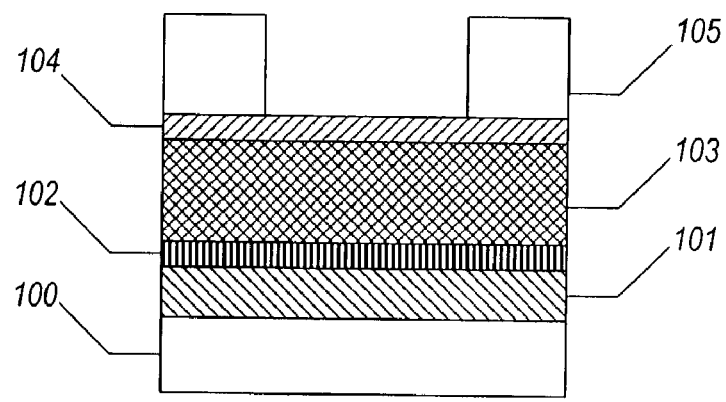
FIGS. 1A–1F illustrate cross-sections of a device that may result after certain steps are used, when making the device using the method according to one embodiment of the present invention.

Still referring to FIG. 1A, after forming conductive layer 101 on substrate 100, barrier layer 102 is formed on conductive layer 101. Barrier layer 102 will serve to prevent an unacceptable amount of copper, or other metal, from diffusing into polymer dielectric layer 103. Barrier layer 102 may also act as an etch stop for preventing subsequent via and trench etch steps from etching into an insulating material formed adjacent to conductive layer 101. Barrier layer 102 preferably is made from silicon nitride, but may be made from other materials that can serve such functions, as is well known to those skilled in the art. When formed from nitride, a chemical vapor deposition process may be used to form barrier layer 102. Conductive layer 101 and barrier layer 102 may be planarized, after they are deposited, using a chemical mechanical polishing (CMP) step.

Dielectric layer 103, also referred to as interlayer dielectric (ILD), comprises a polymer formed on top of barrier layer 102. Dielectric layer 103 may be formed by spin coating the polymer onto the surface of barrier layer 102, using conventionally employed equipment and process steps. Dielectric layer 103 preferably is between about 2,000 and about 20,000 angstroms thick. Dielectric layer 103 preferably has a low dielectric constant; i.e., less than about 3.5 and more preferably less than about 2.0. Because of layer 103's low dielectric constant, the capacitance between various conductive elements that are separated by layer 103 may be reduced, when compared to the capacitance resulting from use of other conventionally used dielectric materials such as silicon dioxide. Such reduced capacitance may decrease the RC delay that would otherwise exist and may also decrease undesirable cross-talk between conductive lines.

Dielectric layer 103 may comprise an organic polymer. Such organic polymers include, for example, polyimides, parylenes, polyarylethers, polynaphthalenes, and polyquinolines, or copolymers thereof. Although several examples of materials that can be used to make dielectric layer 103 have been identified here, any polymer that may insulate one conductive layer from another is within the spirit and scope of the present invention.

Above dielectric layer 103 is hard masking layer 104. The hard masking layer 104 may be formed by chemical vapor deposition, for example. The minimum thickness required for hard masking layer 104 may be dictated by the process used to perform a subsequent polishing step to remove excess metal formed on the surface of that layer. The preferred materials for making hard masking layer 104 are silicon nitride and silicon dioxide, although other materials, such as SiOF, may be used.

Figure 1B:
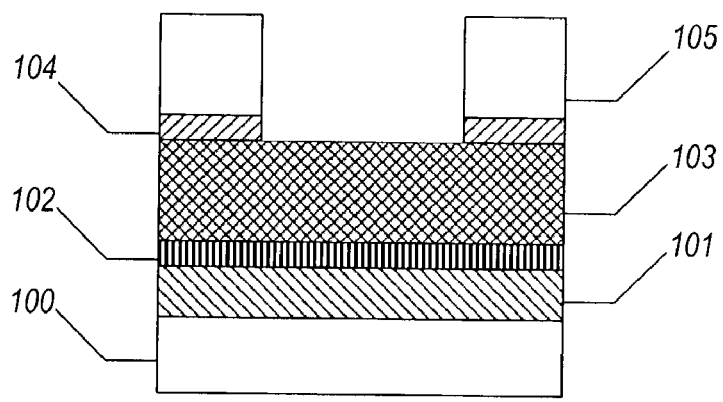

In one embodiment, photoresist layer 105 may be patterned on top of the hard masking layer to define a trench or via formation region for receiving a subsequently formed conductive layer. Photoresist layer 105 may be patterned using conventional photolithographic techniques, such as masking the layer of photoresist, exposing the masked layer to light, then developing the unexposed portions. FIG. 1B shows a semiconductor structure after removal of that part of the hard masking layer not covered by the photoresist.

Figure 1C:
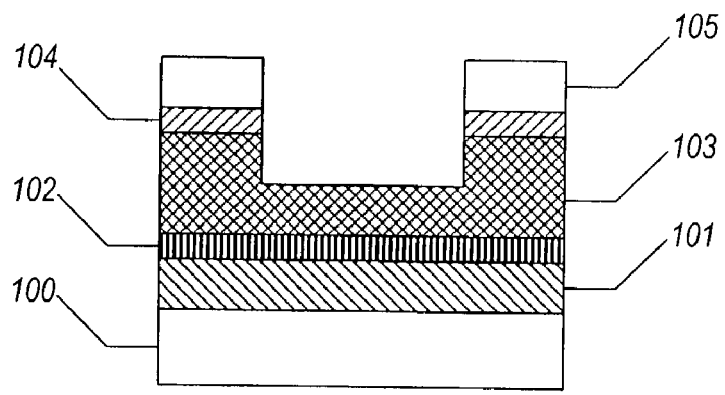

FIG. 1C shows a semiconductor structure after a portion of the polymer dielectric layer 103 has been removed to provide an opening having a first depth. For example, a portion of the polymer dielectric layer may be removed to form an opening by etching the polymer dielectric material. This first or initial removal of dielectric material should not penetrate all the way through the polymer dielectric layer. In other words, the first depth should be sufficiently shallow so that it does not reach barrier layer 102. The first depth may be limited by time, temperature and/or chemical parameters for removing the polymer dielectric material. At least a thin layer of the polymer dielectric remains to define a bottom surface in the opening, which may be referred to as a trench bottom or via bottom. For example, in one embodiment, the polymer dielectric may be etched for approximately 25 seconds using a conventional plasma etch and/or ion beam etch process as is well know to those skilled in the art. The etch chemistry to form an opening in the polymer dielectric layer may include a plasma that contains nitrogen and either hydrogen or oxygen. During the etching, photoresist 105 may be etched at substantially the same rate as the polymer dielectric layer.

Figure 1D:
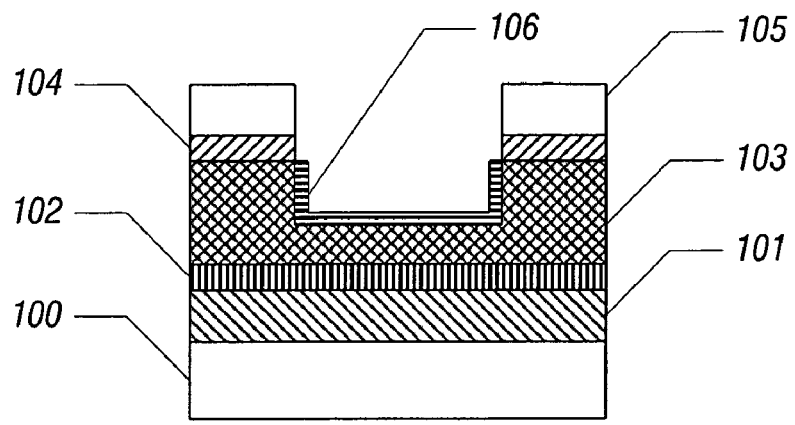

FIG. 1D shows a semiconductor structure after passivating layer 106 is formed over the opening in the polymer dielectric layer. In one embodiment, the passivating layer may be formed on the opposing substantially vertical sidewall surfaces of the previously etched opening in the polymer dielectric. As used herein, substantially vertical means that the sidewall surfaces are substantially normal, or perpendicular, to the horizontal plane of the substrate surface. Additionally, in one embodiment, the passivating layer also may cover some or all of the horizontal bottom surface (i.e., the trench bottom or via bottom) as well as the opposing vertical sidewall surfaces of the opening.

Passivating layer 106 may be formed using conventional equipment used for etching, i.e., an ion beam source and plasma gas chemistry. Preferably, the passivating layer has a depth or thickness of between about 2 nanometers and about 20 nanometers over the polymer dielectric. However, the depth of the passivating layer may be varied based on the chemistry used and time to form the passivating layer. For example, in one embodiment, after the passivating layer is initially formed, it may have a greater depth or thickness on the bottom surface than on the sidewall surfaces. In one embodiment, a passivating layer may be formed in approximately 10 seconds.

In one embodiment, the passivating layer may be a carbon and fluorine-based material such as $CF_2$, $C_2F_4$, etc. The chemistry used to form the passivating layer may be a carbon-fluoro gas or hydrocarbon-flouro gas, such as $C_2F_8$, $C_2F_6$, $CHF_3$, $CH_3F$, or $CH_2F_2$, and also may include or be mixed with other gases such as argon, oxygen or nitrogen. The gas may be broken into several different ions during formation of the passivation layer. The chemistry used to form the passivating layer should be selected so it does not penetrate, attack or etch the polymer dielectric layer significantly.

Figure 1E:
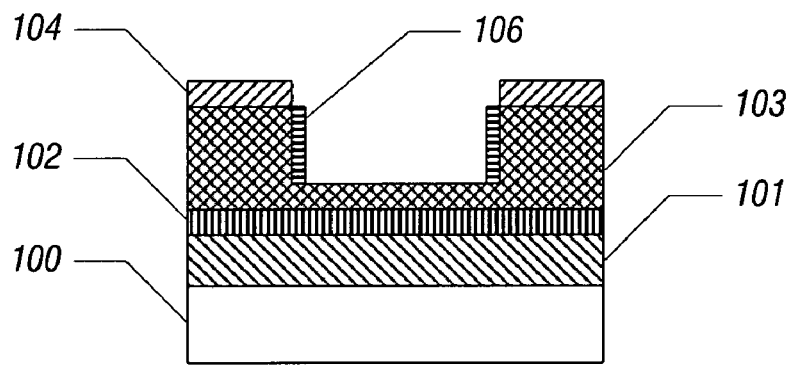
Figure 1F:
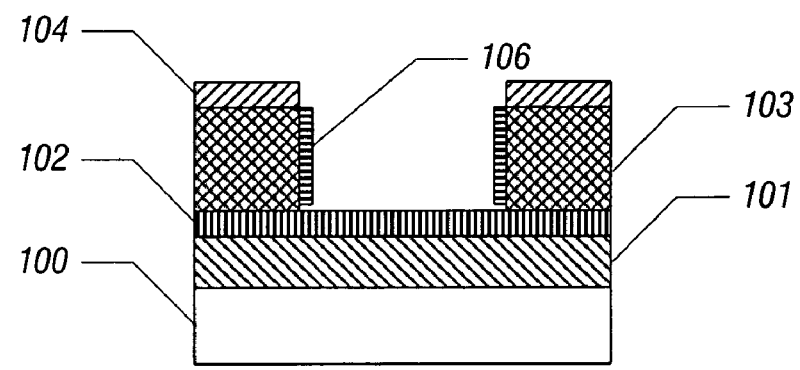

Now referring to FIG. 1E and FIG. 1F, a semiconductor structure is shown after more of the polymer dielectric layer is removed, increasing the depth of the opening to a second depth. The sidewall passivating layer forms a barrier to protect the sidewalls from ion bombardment and/or chemical etchants that could isotropically etch, penetrate and/or removing polymer dielectric material from the sidewalls. Thus, the sidewall passivating layer assures that the opposing sidewalls stay substantially vertical, without undercutting of the polymer dielectric material below the edges of a mask during formation on an opening, such as a trench or via, in the polymer dielectric.

To make the structures shown in FIG. 1E and FIG. 1F, a conventional etch technique may be used to remove more of the polymer dielectric layer at the bottom of the opening, including but not limited to etching using an ion beam and plasma etchant. In one embodiment, the same or similar etch techniques may be used that were used for the initial formation of the opening in the polymer dielectric layer. The ion beam used to remove additional polymer dielectric material should be in a direction normal to the horizontal bottom surface of the opening. If there is passivating material on the bottom surface of the trench, the ion beam may remove that passivating material and the remaining polymer dielectric layer on the bottom surface below the passivating layer. The ion beam source should be configured to penetrate and remove any passivating material The polymer dielectric layer on the bottom surface of the opening may be removed until a second depth is reached. For example, the second depth may be at (e.g., FIG. 1F) or near (e.g., FIG. 1E) the depth of barrier layer 102. In one embodiment, the remaining polymer dielectric material may be removed by etching for approximately 25 seconds. After the removal of the additional dielectric material on the bottom surface, however, some or all of the passivating layer on the sidewall surfaces may remain.

Figure 2:
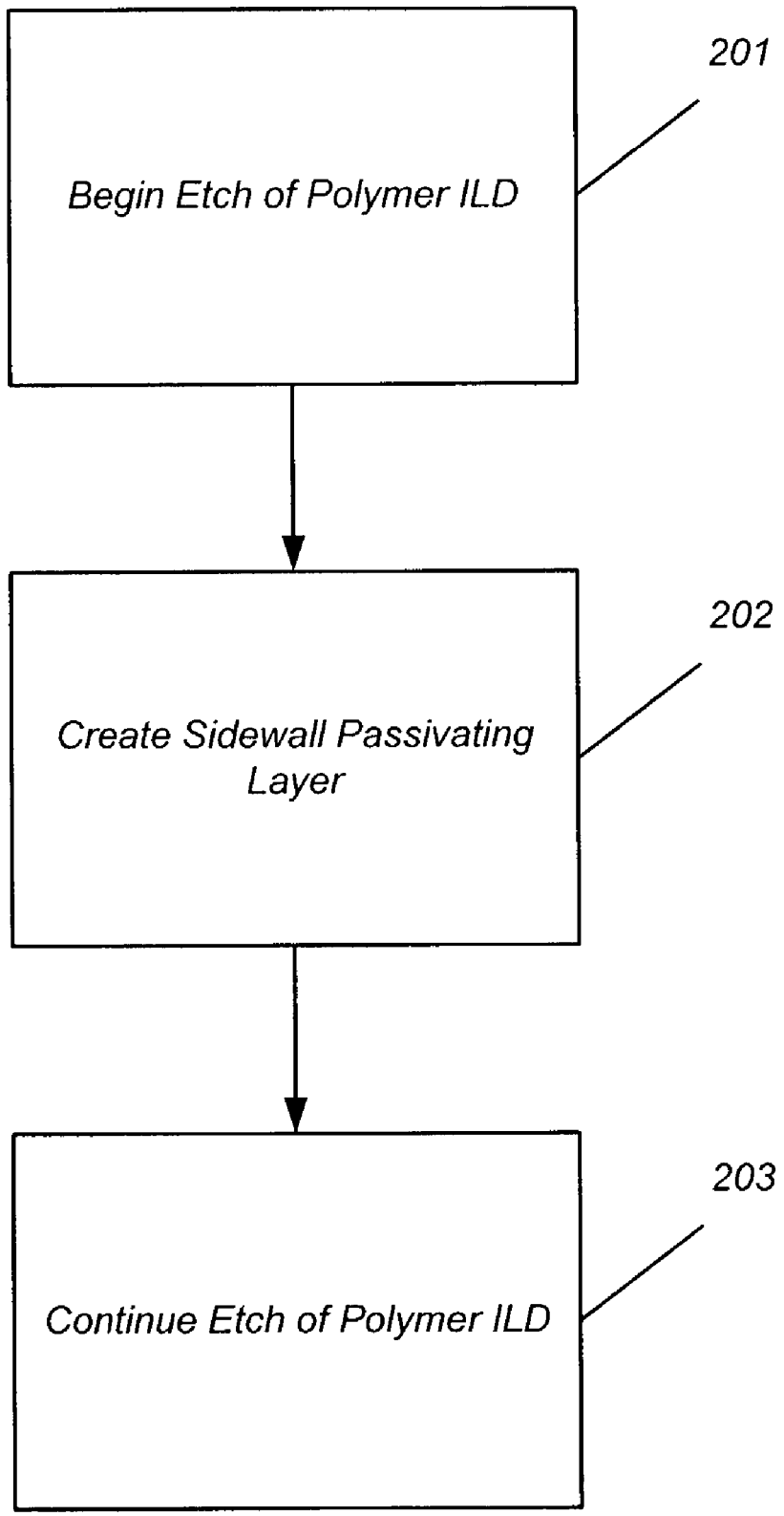
FIG. 2 is a process flow diagram in accordance with one embodiment of the present invention.

FIG. 2 is a process flow diagram that depicts a method of providing a sidewall passivating layer according to one embodiment. In block 201, initial removal of the polymer interlayer dielectric takes place. Initial removal of polymer dielectric material in block 201 creates an opening that does not completely penetrate through the polymer dielectric layer. The opening has a first depth that is sufficiently shallow so that it does not reach the underlying barrier layer.

At least a thin layer of the polymer dielectric remains over the barrier layer. The first depth of the opening may be limited by time, temperature and/or chemical parameters. In one embodiment, the initial removal of polymer dielectric material may be done for approximately one third of the duration of a conventional etch process, i.e., 25 seconds. A conventional plasma etch process may be used, and/or ion beam etch techniques that are well know to those skilled in the art. If a dry etch is used, the etch chemistry may include a plasma that contains nitrogen and either hydrogen or oxygen. During the initial etching, the photoresist layer above the polymer dielectric also may be etched at substantially the same rate as the polymer dielectric layer.

In block 202, a passivating layer is formed on the opposing sidewalls of the opening in the polymer dielectric layer. In one embodiment, the passivating layer also may be formed on the bottom surface of the opening. The passivating layer may be formed by using an ion beam source and suitable etch chemistry to create a layer of carbon and fluorine-based material to a depth or thickness of between about 2 nanometers and about 20 nanometers. In one embodiment, the passivating layer may reach a greater depth over the bottom surface than the sidewall surfaces of the opening.

The chemistry used to form the passivating layer in block 202 may include a carbon-fluoro gas, such as $C_2F_8$, $C_2F_6$, $CHF_3$, $CH_3F$, $CH_2F_2$, or $CH_3F$, and also may include or be mixed with other gases such as argon, oxygen or nitrogen. The depth of the passivating layer may depend on the time, chemistry and other parameters. In one embodiment, a passivating layer may be formed in approximately 10 seconds.

In block 203, additional polymer dielectric material may be removed from the bottom of the opening to reach a second depth. The same or similar methods or techniques may be used as in block 201. For example, conventional etch techniques may be used that include ion bombardment and/or etch chemistries. If there is a passivating layer on the bottom surface, ion beam etching techniques may be used to remove the passivating layer therefrom, as well as the remaining polymer dielectric layer on the bottom surface of the opening, until reaching a second depth. In one embodiment, the second depth may be at or near the barrier layer. Techniques for removal of the polymer dielectric include employing an ion beam in a direction normal to the substrate surface. Such techniques allow removal of the passivating layer and the polymer dielectric from the bottom surface of the opening, without significantly penetrating or removing the passivating layer and/or polymer dielectric from the sidewall surfaces. In one embodiment, the remaining polymer dielectric material may be removed from the bottom surface of the opening in approximately 25 seconds.

After the polymer dielectric is removed from the bottom surface of the opening to reach a desired via or trench depth, some or all of the passivating layer may remain on the sidewall surfaces. Significantly, the passivating layer on the sidewalls protects the polymer dielectric sidewalls from isotropic etching that may result in undercutting. Optionally, some or all of the passivating material remaining on the sidewalls may be removed subsequently through a conventional wet clean process.

In one embodiment, the passivating layer may be formed between cycles of a cyclic etch process. For example, a polymer dielectric etch process of 75 seconds duration may be split into two or more intervals, and the sidewall passivating layer may be formed between two of the intervals. In one embodiment, the polymer dielectric etch process is divided into three 25 second intervals.

As a result of including a sidewall passivating layer, an opening in the polymer dielectric layer may have a significantly improved profile for a via or trench. The improved etch profile may be characterized by vertical sidewalls, with little or no undercutting of the polymer dielectric material below the edges of a hard mask. Thus, the present invention significantly reduces the undercut or etch bias of a low-k polymer dielectric.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
    forming an opening in a polymer interlayer dielectric at two different times using one etch chemistry, the opening having a bottom surface and a sidewall surface, the bottom surface spaced apart from an underlying barrier surface at the end of a first time; and
    in the interval between the two different times, forming a passivating layer over at least the sidewall surface of the opening to protect said sidewall surface while said opening is formed at a second time, said passivating layer formed using another etch chemistry, said another etch chemistry to include carbon and fluorine and to not significantly etch said interlayer dielectric.

2. The method of claim 1 further comprising at said second time, etching the remaining polymer interlayer dielectric at the bottom surface using an ion beam source.

3. The method of claim 1 wherein forming the passivating layer comprises depositing a plasma including carbon and fluorine.

4. The method of claim 1 wherein forming the passivating layer comprises forming the passivating layer to a depth of between about 2 nanometers and about 20 nanometers.

5. The method of claim 1 further comprising cleaning the passivating layer off the sidewall surface after said second time.

6. The method of claim 1 wherein forming the passivating layer comprises forming the passivating layer on the bottom surface and the sidewall surface of the opening.

7. The method of claim 1 wherein protecting said sidewall includes blocking the removal of remaining polymer dielectric on the sidewall surface of the opening while said opening is formed at said second time.

8. A method comprising:
    during a first etch cycle, forming an opening in a polymer dielectric layer using a first etchant, said opening having a sidewall surface and a bottom that is spaced apart from an underlying barrier layer;
    during a second etch cycle, removing a passivating layer together with the polymer dielectric layer at the bottom of the opening to increase the depth of the opening using an etchant other than a second etchant;
    during an interval between said first and second etch cycles, forming said passivating layer over said opening using said second etchant, said second etchant other than said first etchant and based on a source that includes carbon and fluorine; and
    removing the passivating layer from the sidewall surface after the depth of the opening is increased.

9. The method of claim 8 wherein forming the passivating layer over the opening in the polymer dielectric layer includes forming said passivating layer during an interval of about 10 seconds and removing the passivating layer together with said polymer dielectric layer during a second etch cycle of less than about 37.5 seconds.

10. The method of claim 8 wherein forming a passivating layer includes exposing said opening to said second etchant for about 25 seconds.

11. The method of claim 8 including forming the passivating layer to a depth of between about 2 nanometers and about 20 nanometers.

12. The method of claim 1 wherein forming an opening in a polymer interlaver dielectric includes forming an opening in a single polymer dielectric layer.

13. The method of claim 1 wherein forming an opening in a polymer interlaver dielectric includes at said second time, etching the polymer dielectric material to form an opening having a bottom surface that is optionally spaced apart from the underlying barrier layer.

14. A method comprising:
   forming an opening having a sidewall surface and a bottom in a single polymer dielectric layer using an oxygen-based etch chemistry, the bottom of the opening spaced apart from an underlying barrier layer;
   forming a passivating layer over the opening using a carbon and fluorine-based etch chemistry having a low etch rate; and
   after forming said passivating layer, concurrently removing the passivating layer and the polymer dielectric layer to increase the depth of the opening using an etchant other than said carbon and fluorine-based etch chemistry, the bottom of the increased opening selectively spaced apart from the baffler layer.

15. The method of claim 14 wherein forming the passivating layer comprises forming a carbon and fluorine based material over the polymer dielectric material.

16. The method of claim 14 further comprising cleaning the passivating layer from the sidewall surface.

17. The method of claim 14 wherein forming the passivating layer comprises forming a passivating layer to a depth of between about 2 nanometers and about 20 nanometers.

18. The method of claim 14 including etching the opening in the polymer dielectric layer before depositing the passivating layer.

19. The method of claim 14 including removing the passivating layer from the bottom of the opening while protecting the sidewall from undercutting.

20. The method of claim 14 wherein forming an opening, forming a passivating layer, and concurrently removing the passivating layer and polymer dielectric occur in sequential cycles of less than about 37.5 seconds each.

* * * * *

UNITED STATES PATENT AND TRADEMARK OFFICE
CERTIFICATE OF CORRECTION

| | |
|---|---|
| PATENT NO. | : 7,176,122 B2 |
| APPLICATION NO. | : 10/379061 |
| DATED | : February 13, 2007 |
| INVENTOR(S) | : Hyun-Mog Park |

It is certified that error appears in the above-identified patent and that said Letters Patent is hereby corrected as shown below:

Column 6:
Line 32, "interlaver" should be --interlayer--.

Column 8:
Line 6, "baffler" should be --barrier--.

Signed and Sealed this

Fourteenth Day of August, 2007

JON W. DUDAS
*Director of the United States Patent and Trademark Office*